(12) United States Patent
Baumann et al.

(10) Patent No.: US 8,847,604 B2
(45) Date of Patent: *Sep. 30, 2014

(54) SEMICONDUCTOR DEVICE WITH A TEST CIRCUIT AND A REFERENCE CIRCUIT

(75) Inventors: Thomas Baumann, Anzing (DE);
Georg Georgakos, Erding (DE);
Christian Pacha, Neukeferloh (DE);
Anselme Urlick Tchegho Kamgaing,
Aachen (DE)

(73) Assignee: Infineon Technologies AG, Neubiberg (DE)

(*) Notice: Subject to any disclaimer, the term of this patent is extended or adjusted under 35 U.S.C. 154(b) by 448 days.

This patent is subject to a terminal disclaimer.

(21) Appl. No.: 13/298,316

(22) Filed: Nov. 17, 2011

(65) Prior Publication Data
US 2012/0062257 A1    Mar. 15, 2012

Related U.S. Application Data

(63) Continuation of application No. 12/363,839, filed on Feb. 2, 2009, now Pat. No. 8,081,003.

(51) Int. Cl.
*G01R 31/02* (2006.01)
*G01R 23/14* (2006.01)
*H03D 13/00* (2006.01)
*G01R 31/3181* (2006.01)
*G01R 31/30* (2006.01)
*G01R 31/317* (2006.01)
*G01R 31/28* (2006.01)

(52) U.S. Cl.
CPC ...... *G01R 31/3181* (2013.01); *G01R 31/31703* (2013.01); *G01R 31/3016* (2013.01); *G01R 31/2856* (2013.01)
USPC ................ 324/537; 324/76.41; 324/76.77

(58) Field of Classification Search
USPC .............. 324/537, 500, 76.11, 76.19, 76.41, 324/76.52, 76.77; 365/201, 233.1; 714/724, 714/736
See application file for complete search history.

(56) References Cited

U.S. PATENT DOCUMENTS 5,619,462 A * 4/1997 McClure ................... 365/201
6,900,655 B2 * 5/2005 Kumamoto ............... 324/750.3

* cited by examiner

*Primary Examiner* — Hoai-An D Nguyen
(74) *Attorney, Agent, or Firm* — Schiff Hardin LLP

(57) ABSTRACT

Implementations are presented herein that include a test circuit and a reference circuit.

25 Claims, 7 Drawing Sheets

US 8,847,604 B2

SEMICONDUCTOR DEVICE WITH A TEST CIRCUIT AND A REFERENCE CIRCUIT

RELATED APPLICATION INFORMATION

The present application is a continuation application of U.S. patent application Ser. No. 12/363,839, filed on Feb. 2, 2009. U.S. patent application Ser. No. 12/363,839 is hereby incorporated by reference herein.

BACKGROUND

Modern electronic systems, for example, mobile phones, digital cameras and personal digital assistants, have an ever increasing demand for highly-integrated and energy-efficient semiconductor circuits. In order to meet these requirements, the physical size of field effect transistors (FETs) within the semiconductor circuits is reduced. Furthermore, the voltage supply is reduced to save power as well as to meet the requirements of the reduction in the physical size of the FETs and to avoid an increase of electrical fields of scaled FETs.

Due to the shrinking size and the reduction of the voltage, the FETs become more susceptible to degradation effects, like Negative Bias Temperature Instability (NBTI), HCI (Hot Carrier Instability) and Positive Bias Temperature Instability (PBTI). These degradation effects occur over the lifetime of the semiconductor circuits and are accelerated by high temperatures, high voltages, and a high number of switching events in digital circuits. NBTI causes a shift of a threshold voltage (VT) of a p-channel field effect transistor (pFET) and similarly, PBTI causes a shift of VT of an n-channel field effect transistor (nFET). HCI affects the mobility of carries in FETs and is caused by switching events in the digital circuits, when input and output nodes of a logic gate are changing their logic states.

In order to avoid malfunction of a semiconductor circuit, degradation of the semiconductor circuit needs to be monitored. Malfunctions that may occur due to degradation include a reduction of the switching speed of digital circuits, a relative delay shift of synchronous signals within a semiconductor circuit, such as clock signals at different parts of the semiconductor circuit, or a complete non-functionality of pipelined circuits due to hold time variations.

BRIEF DESCRIPTION OF THE DRAWINGS

The detailed description is described with reference to the accompanying figures. In the figures, the left-most digit of a reference number identifies the figure in which the reference number first appears. The use of similar reference numbers in different instances in the description and the figures may indicate similar or identical items.

FIG. 1 shows an exemplary circuit arrangement 100 with a test circuit 102 and a reference circuit 104. The circuit arrangement 100 may operate in a first mode or in a second mode. The mode may be set by way of a signal 106, which may be referred to as "mode signal" herein. In the first mode, the test circuit 102 operates synchronously with a clock 108 and, in the second mode, the test circuit 102 operates asynchronously with respect to the clock 108. Furthermore, in the second mode, the reference circuit 104 operates asynchronously with respect to the test circuit 102.

Figure 1:
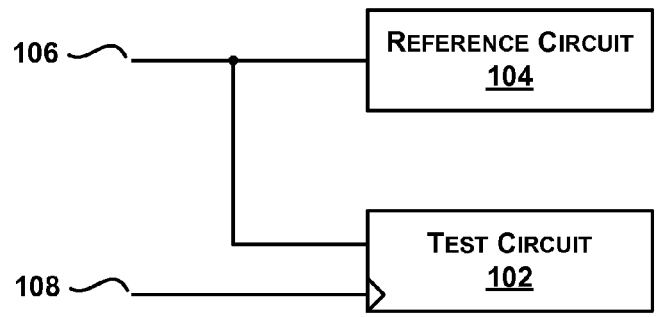
FIG. 1 shows an exemplary circuit arrangement with a test circuit and a reference circuit.

The clock 108 may be a local system clock of one or more functional circuits that all belong to a common clock domain of a semiconductor device. That is, each of the one or more functional circuits may be clocked by the clock 108. In one implementation, the clock 108 may be a gated clock. In order to reduce a power consumption of the semiconductor device, the clock 108 may be turned off during periods of time when a functionality of the one or more functional circuits is not required. In the first mode, the test circuit 102 is coupled to the clock 108 and therefore, it may encounter the same clock activity as a functional circuit that belongs to the clock domain of the clock 108. Devices of the test circuit 102 may be subject to aging in accordance with an activity of the clock 108. Therefore, the test circuit 102 may provide a representation of an aging state of a functional circuit with respect to the clock activity. The test circuit 102 may be referred to as "stressed test circuit" or "aged test circuit" herein.

In the second mode, the test circuit 102 is decoupled from the clock 108 and it operates asynchronously with respect to the clock 108. In the second mode, an aging status of the test circuit 102 may be determined, for example, by measuring a performance of the test circuit 102. The second mode may be referred to as a "measurement mode" herein.

In one implementation, the test circuit 102 may have a similar or an identical structure as a functional circuit or as a circuit path of the functional circuit of a semiconductor device. For example, the test circuit 102 may include a circuit path that corresponds to a critical path of a functional circuit and the functional circuit may belong to the clock domain of the clock 108. In this case, the test circuit 102 may provide a representation of an aging state of a functional circuit with respect to the structure as well as with respect to the clock activity. In other words, the test circuit 102 and the aging of the test circuit 102 may be specific to a semiconductor device or to a part of the semiconductor device.

In general, the circuit arrangement 100 may be implemented to monitor an aging of a semiconductor device or of a part of the semiconductor device by way of the test circuit 102. In the measurement mode, an aging state of the test circuit 102 may be determined by comparing the performance of the test circuit 102 with a performance of the reference circuit 104. The reference circuit 104 may operate asynchronously with respect to the test circuit 102 and it may operate asynchronously with respect to the clock 108.

In one implementation, the reference circuit 104 may have the same structure as the test circuit 102. An identical structure of the test circuit 102 and the reference circuit 104 may allow for a direct comparison of the performance of the test circuit 102 with a performance of the reference circuit 104. Therefore, the comparison may be performed by way of a simple circuit and the comparison operation may be executed quickly.

Figure 2:
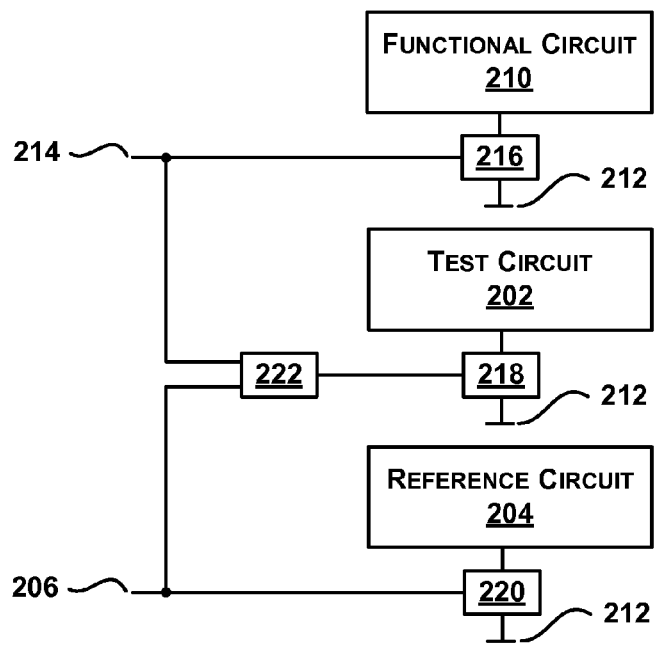
FIG. 2 shows an exemplary circuit arrangement with a test circuit, a reference circuit and a functional circuit.

FIG. 2 shows an exemplary circuit arrangement 200 with a test circuit 202, a reference circuit 204 and a functional circuit 210. The circuit arrangement 200 may operate in a first mode or in a second mode. The mode may be determined by a mode signal 206. As was described in connection with FIG. 1, the first mode may be referred to as a "stress mode" and the second mode may be referred to as a "measurement mode". Furthermore, as was described in connection with FIG. 1, the test circuit 202 may have an identical structure as the functional circuit 210 or as a circuit path of the functional circuit 210, and the reference circuit 204 may have the same structure as the test circuit 202. An aging state of the test circuit 202 may be determined by comparing a performance of the test circuit 202 with a performance of the reference circuit 204, and the test circuit 202 may provide a representation of an aging state of the functional circuit 210.

Referring to FIG. 2, the test circuit 202, the reference circuit 204 and the functional circuit 210 are all coupled to a common supply voltage 212. The functional circuit 210 may be part of a semiconductor device, and the supply voltage 212 may define a power domain of the semiconductor device. That is, the test circuit 202 and the reference circuit 204 may belong to the same power domain as the functional circuit 210.

The functional circuit 210 may be disconnected temporarily from the supply voltage 212. For example, in order to reduce a power consumption of the semiconductor device, the functional circuit 210 may be powered off whenever the functionality of the functional circuit 210 is not required. In the following sections, an operation of each of the test circuit 202 and the reference circuit 204 in the stress mode and in the measurement mode will be described in more detail.

In the stress mode, the test circuit 202 may be disconnected from the supply voltage 212 at the same time the functional circuit 210 is disconnected from the supply voltage 212. A signal 214 may control a switching of the supply voltage 212 for each of the functional circuit 210 and the test circuit 202. The signal 214 may be referred to as a "standby signal" herein. In the stress mode, devices of the test circuit 202 may be subject to aging in accordance with the switching of the supply voltage 212. The devices of the test circuit 202 may encounter the same power activity as devices of the functional circuit 210 and therefore, the test circuit 202 may represent an aging of the functional circuit 210 in terms of power activity.

In the measurement mode, the test circuit 202 may be connected to the supply voltage 212. The mode signal 206 and the standby signal 214 may be combined in a combinational logic circuit stage 222 and an output of the combinational logic circuit stage 222 may control the switching of the supply voltage 212 of the test circuit 202. The combinational logic circuit stage 222 may include an OR-gate that may combine the mode signal 206 and the standby signal 214 such that the test circuit 202 either is enabled in the measurement mode or is enabled when the functional circuit 210 is connected to the supply voltage 212.

In the stress mode, the reference circuit 204 may be disabled, e.g., by disconnecting the supply voltage 212 from the reference circuit 204. In the measurement mode, the reference circuit 204 may be connected to the supply voltage 212 in order to allow for a comparison of the performance of the test circuit 202 with the performance of the reference circuit 204. In one implementation, in the measurement mode, each of the test circuit 202 and the reference circuit 204 may be connected to the supply voltage 212 in order to allow for the comparison.

In the stress mode, as the supply voltage 212 is disconnected from the reference circuit 204, no voltage difference may be applied to internal nodes of the reference circuit 204, so the reference circuit 204 may avoid aging. Therefore, the reference circuit 204 may be referred to as a "non-stressed reference circuit" or a "non-aged reference circuit" herein. The reference circuit 204 may be protected against aging by avoiding stress conditions on all FET transistors within the reference circuit 204. This is achieved by having no voltage drops between drain, source and gate terminals of the FET transistors. Generally, aging effects such as NBTI and HCI require at least a voltage drop of typically larger than 0.5V before electrical fields are large enough to initiate device degradation. In the measurement mode, the reference circuit 204 may provide an accurate reference for a non-aged circuit as the performance of the reference circuit 204 may not be deteriorated due to aging.

Referring to FIG. 2, the switching of the supply voltage 212 may be performed by way of switch devices 216, 218 and 220. The switch devices 216, 218 and 220 may switch the supply voltage 212 responsive to the standby signal 214 and/or the mode signal 206. In one implementation, at least one of the switch devices 216, 218 and 220 may include a FET transistor, and the standby signal 214 and/or the mode signal 206 may be coupled to a gate terminal of the FET transistor to control the switching of the supply voltage 212. In one implementation, each of the switch devices 216, 218 and 220 may be designed identically.

The supply voltage 212 may be a ground supply voltage or a power supply voltage. In one implementation, both the ground supply voltage and the power supply voltage may be switched. In this case, for each of the functional circuit 210, the test circuit 202 and the reference circuit 204, a first switch device may switch the ground supply voltage and a second switch device may switch the power supply voltage. The first switch device and the second switch may be controlled by the same signal, which may be the standby signal 214, the mode signal 206 or a logical combination of the standby signal 214 and the mode signal 206. In the implementation where the supply voltage 212 is a ground supply voltage, each of the switch devices 216, 218 and 220 may be an nFET. In the implementation where the supply voltage 212 is the power supply voltage, each of the switch devices 216, 218 and 220 may be a pFET.

The implementation as illustrated and described in connection with FIG. 1 may be combined at least partly with the implementation as illustrated and described in connection with FIG. 2. Two exemplary combinations will be described in more detail herein.

In a first exemplary combination of FIG. 1 and FIG. 2, a supply voltage of the reference circuit 104 of FIG. 1 may be switched by way of a switch device analogous to the switch device 220 of FIG. 2. That is, in the stress mode, the reference circuit 104 of FIG. 1 may be disabled and it may be protected against aging by disconnecting the supply voltage. As the devices of the reference circuit 104 may be prevented from aging, the performance of the reference circuit 104 may provide an accurate reference for a performance of a non-aged circuit. In the measurement mode, the reference circuit 104 may be connected to the supply voltage to allow for a comparison of the performance of the test circuit 102 with the performance of the reference circuit 104.

In a second exemplary combination of FIG. 1 and FIG. 2, the test circuit 102 may be coupled to the same supply voltage as a functional circuit. A switching of the supply voltage may be controlled by way of switch devices analogous to the switch devices 216 and 218 of FIG. 1. Furthermore, the test circuit 102 may be coupled to the same clock 108 as the functional circuit. The test circuit 102 and the functional circuit may belong to the same clock domain as well as to the same power domain. During operation of a semiconductor device, the clock activity and/or the power activity of the functional circuit may vary depending on a use thereof. In the stress mode, the test circuit 102 may encounter the same clock activity and the same power activity as the functional circuit. Therefore, the test circuit 102 may serve as a reference for the functional circuit in terms of aging.

In general, the test circuit 102 and 202 may serve as an accurate aging monitor for at least a part of a semiconductor device. The test circuit 102 and 202 may be composed similar to or equivalent to a functional circuit of the semiconductor device, so the test circuit 102 and 202 may encounter the same stress conditions as the functional circuit. Therefore, the test circuit 102 and 202 may be used to accurately determine the aging status of at least a part of a semiconductor device.

The implementations as illustrated and described in connection with FIGS. 1-2 may be integrated easily into an existing design of a semiconductor device, with limited or no modification thereof. In addition, the integration of one of the implementations may only require a small area. Furthermore, a circuit arrangement according to one of the implementations may include purely digital logic. Therefore, only little design effort may be required to transfer the circuit arrangement to a different process technology.

Figure 3:
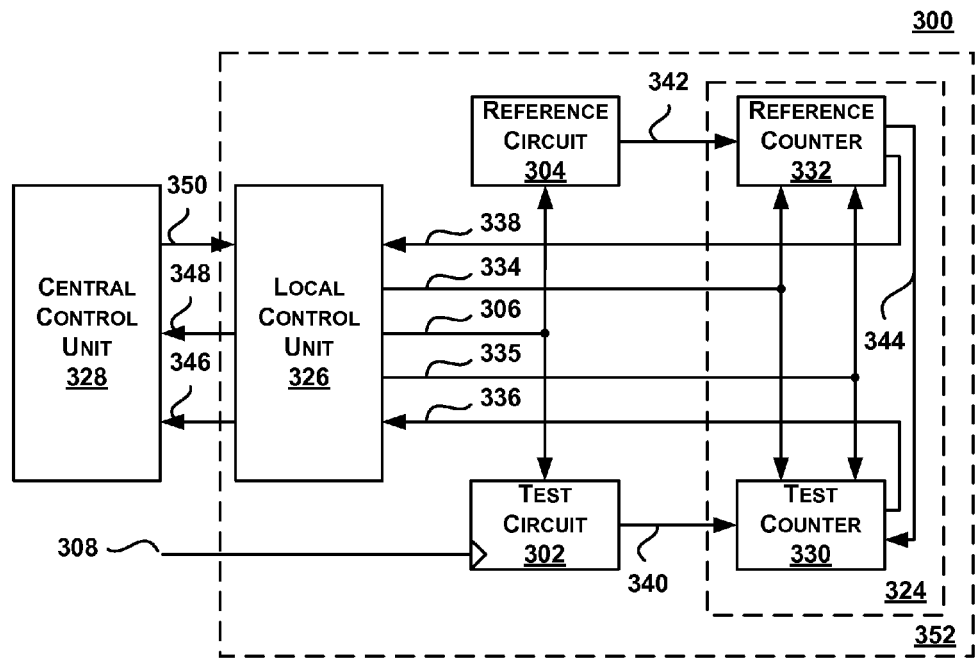
FIG. 3 shows an exemplary circuit arrangement with a test circuit, a reference circuit and an evaluation circuit.

FIG. 3 shows a further exemplary circuit arrangement 300. The circuit arrangement 300 includes a test circuit 302, a reference circuit 304, a mode signal 306 and a clock signal 308. The arrangement of those elements may be similar or identical to the implementations as illustrated and described in connection with FIGS. 1-2. The circuit arrangement 300 further includes an evaluation circuit 324, a local control unit 326 and a central control unit 328.

The local control unit 326 may control an operation of the test circuit 302, the reference circuit 304 and the evaluation circuit 324. For example, the local control unit 326 may provide the mode signal 306 to the test circuit 302 and to the reference circuit 304.

The evaluation circuit 324 may be coupled to an output of the test circuit 302 via a test circuit output signal 340 and to an output of the reference circuit 304 via a reference circuit output signal 342. In the measurement mode, the test circuit output signal 340 may oscillate at a frequency f1 that may correspond to a performance of the stressed test circuit 302, and the reference circuit output signal 342 may oscillate at a frequency f2 that may correspond to a performance of the non-stressed reference circuit 304. In the stress mode, as illustrated and described in connection with FIGS. 1-2, the test circuit 302 may be subject to aging, so devices of the test circuit 302 may degrade. In contrast to that, in the stress mode, the reference circuit 304 may be disabled to prevent aging. Consequently, in the measurement mode, the frequency f1 may be less than the frequency f2, i.e., the aged test circuit 302 may be slower than the non-aged reference circuit 304.

In one implementation (not shown in FIG. 3), the evaluation circuit 324 may include at least two time-to-digital converters to determine a difference between frequency f1 and frequency f2. In this implementation, a time difference between an oscillation period t1=1/f1 and an oscillation period t2=1/f2 is measured by a high resolution time measurement. In another implementation, the evaluation circuit 324 may determine the difference by employing a differential frequency measurement technique. The differential frequency measurement technique may provide accurate results, as it may eliminate an effect of common-mode environmental variations, such as temperature and global process variations, which may affect the test circuit 302 and the reference circuit 304 in the same way. In one implementation (not shown in FIG. 3), the differential frequency measurement technique may be implemented by measuring a beat frequency of the test circuit output signal 340 and the reference circuit output signal 342. In another implementation, the differential frequency measurement may be performed by way of counters as will be described in connection with FIG. 3 further herein.

The evaluation circuit 324 may include a test counter 330 that is coupled to the test circuit output signal 340 and a reference counter 332 that is coupled to the reference circuit output signal 342. Each of the test counter 330 and the reference counter 332 may include n stages, i.e., each of the test counter 330 and the reference counter 332 may have a resolution of n bits. The local control unit 326 may provide a measurement control signal 334 to each of the test counter 330 and the reference counter 332. The measurement control signal 334 may initiate each of the test counter 330 and the reference 332 to start counting and de-counting, respectively. In other words, the measurement control signal 334 may start a measurement phase. The local control unit 326 may further provide a set signal 335 to control a setting of the test counter 330 and of the reference counter 332 to a predetermined value. The test counter 330 and the reference counter 332 may be set to the predetermined value before or substantially at the same time as the start of the measurement phase.

In one implementation, each of the test counter 330 and the reference counter 332 may be set to the same value. For example, the test counter 330 and the reference counter 332 may be initialized by being set to their maximum value, i.e., all n bits may be set to a logic '1' value. During the measurement phase, the test counter 330 may be decremented with every cycle of the test circuit output signal 340. Likewise, the reference counter 332 may be decremented with every cycle of the reference output signal 342. As the non-aged reference circuit 304 may be faster than the aged test circuit 302, the reference counter 332 may reach a zero value first. As soon as the reference counter 332 may reach the zero value, it may activate a stop signal 344. The stop signal 344 may be provided to the test counter 330 and may cause the test counter 330 to stop de-counting. The value of the test counter 330 at the time when it is stopped by the stop signal 344 may indicate directly the difference in performance between the aged test circuit 302 and the non-aged reference circuit 304. In other words, the aging state of the test circuit 302 may be directly derived from the value of the test counter 330 without the need for any subtraction operation, or the like. The counter value of the test counter 330 may be an n-bit digital output word and it may be provided in parallel to the local control unit 326 via a test counter state signal 336. Alternatively, the test counter 330 may be configured as a shift register and the counter value of the test counter 330 may be serially transferred to the local control unit 326.

The local control unit 326 may provide the counter value to the central control unit 328 via a measurement result signal 346. The counter value may be converted within the local control unit 326 and it may be transferred serially from the local control unit 326 to the central control unit 328. Additionally or alternatively, the counter value may be stored in a memory unit. The local control unit 326 may further provide a status signal 348 to the central control unit 328, where the status signal 348 may denote an end of the measurement phase. The central control unit 328 may provide a control signal 350 to the local control unit, and the local control unit 326 may generate the mode signal 306 and the measurement control signal 334 responsive to the control signal 350.

The test circuit 302, the reference circuit 304, the local control unit 326, the test counter 330 and the reference counter 332 may together form a local monitor unit 352. Several local monitor units may be positioned at various locations in a semiconductor device. For example, local monitor units may be positioned in different power domains and/or in different clock domains. As aging of a circuit depends on various parameters, like supply voltage, switching activity and temperature, an aging state of a circuit in a semiconductor device may differ depending on its position on the chip. By way of the several local monitor units, variations of aging within the semiconductor device may be determined. The central control unit 328 may be implemented just once in the semiconductor device in order to centrally control the several local monitor units.

Figure 4:
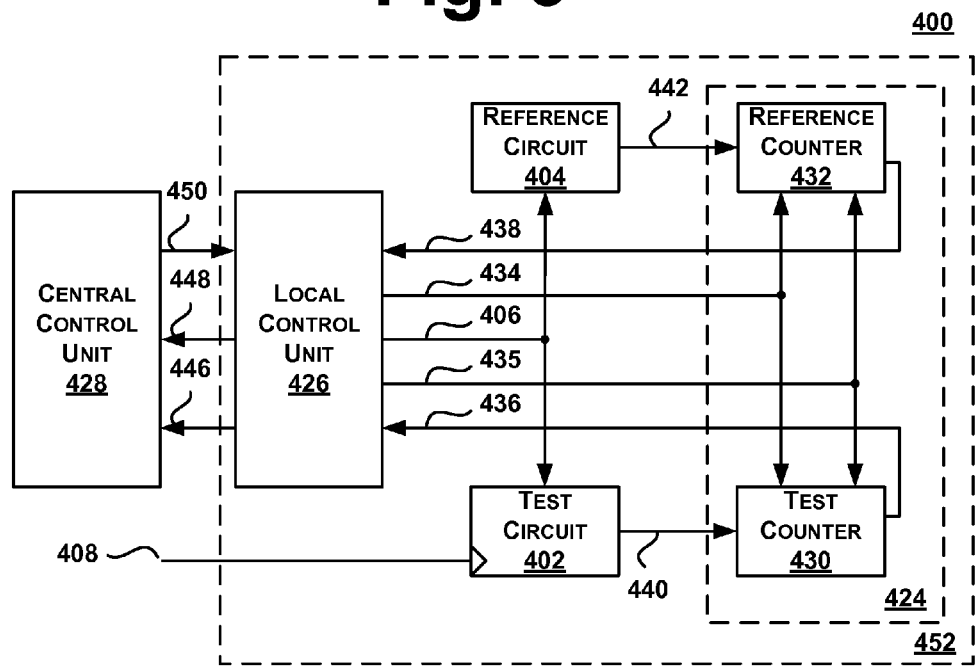
FIG. 4 shows a further exemplary circuit arrangement that is similar to the circuit arrangement of FIG. 3.

FIG. 4 shows a further exemplary circuit arrangement 400. The circuit arrangement 400 is similar to the circuit arrangement 300 as illustrated and described in connection with FIG. 3. Therefore, those elements common to FIG. 3 may not be discussed in detail in the following. The following description of FIG. 4 will focus on differences between the circuit arrangement 400 and the circuit arrangement 300.

Similar to the implementation as illustrated and described in connection with FIG. 3, each of a test counter 430 and a reference counter 432 is started by way of a measurement control signal 434 that is received from a local control unit 426. In contrast to the implementation of FIG. 3, each of the test counter 430 and the reference counter 432 is stopped by way of the measurement control signal 434. That is, the test counter 430 and the reference counter 432 may be stopped concurrently. The local control unit 426 may provide the measurement control signal 434 responsive to a control signal 450 that is received from a central control unit 428. The local control unit 426 may receive a value of the test counter 430 via a test counter state signal 436 and a value of the reference counter 432 via a reference counter state signal 438. After the test counter 430 and the reference counter 432 are stopped, the local control unit 426 may determine a difference between the value of the test counter 430 and the value of the reference counter 432, and the local control unit 426 may provide the difference to the central control unit 428 via a measurement result signal 446. The difference may be indicative of an aging state of the test circuit 402.

The central control unit 428 may control several local monitor units 452 that are distributed in a semiconductor device in order to measure variations of aging within the semiconductor device. In one implementation, the central control unit 428 may control several local monitor units such that the several local monitor units concurrently start and stop counting and de-counting, respectively, the test counters and the reference counters. Thus, an aging state of various parts of the semiconductor device may be measured concurrently. In one implementation, the central control unit 428 may include an arithmetic unit to calculate differences of aging states of the several local monitor units. In another implementation, the central control unit 428 may be an interface unit of a microprocessor or a DSP that is used to calculate the differences of the aging states of the several local monitor units.

Figure 5:
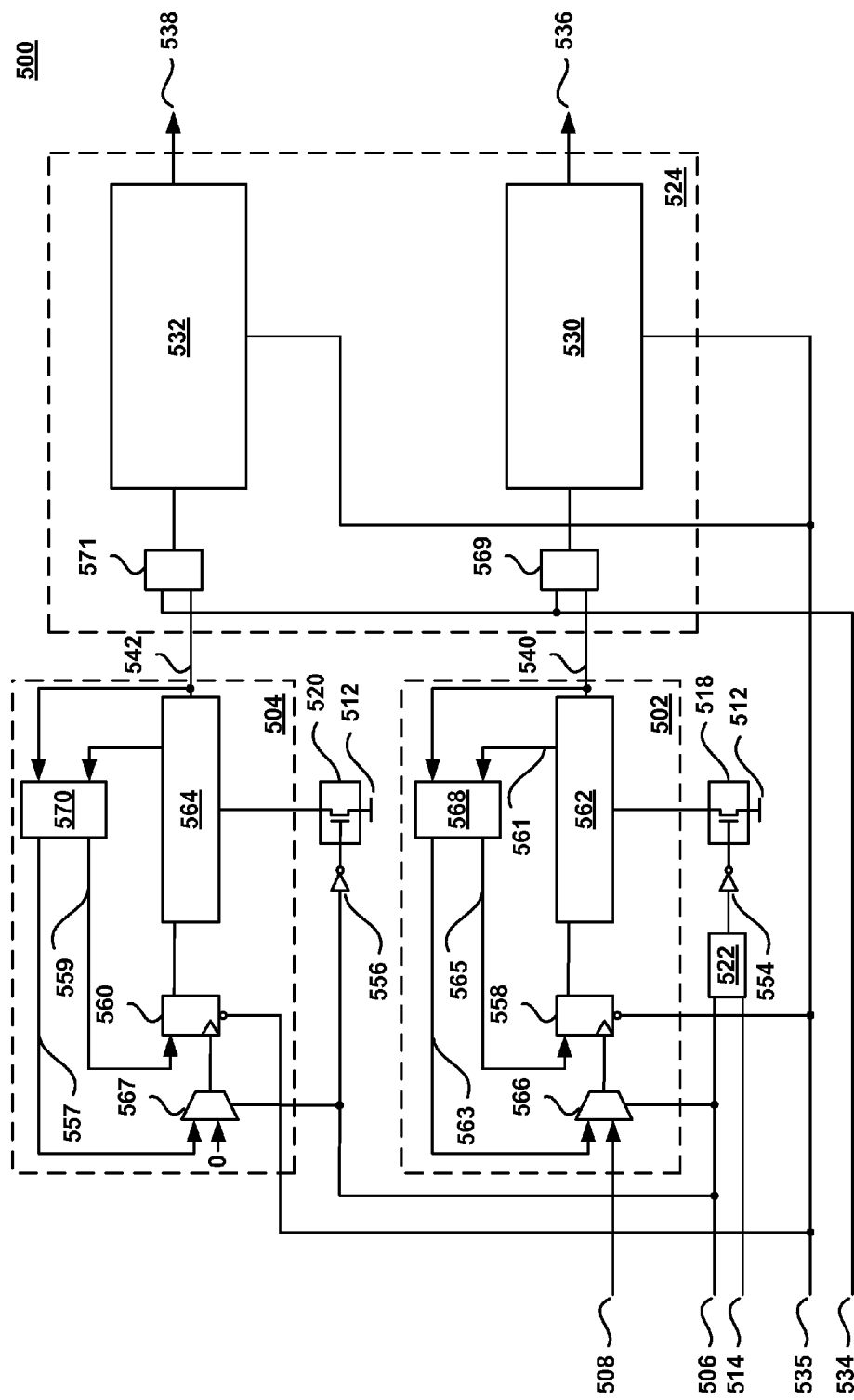
FIG. 5 shows an exemplary circuit arrangement according to one of the implementations as illustrated in FIGS. 1-4 in more detail.

FIG. 5 shows an exemplary circuit arrangement 500 according to one of the implementations as illustrated and described in connection with FIGS. 1-4 in more detail. The circuit arrangement 500 includes a test circuit 502, a reference circuit 504 and an evaluation circuit 524.

According to an implementation as illustrated and described in connection with FIG. 2, the test circuit 502 may be coupled to a supply voltage 512 by way of a switch device 518. The switch device 518 may switch the supply voltage 512 responsive to a standby signal 514 and/or a mode signal 506. In a measurement mode, the test circuit 502 may be connected to the supply voltage 512 to allow for determining a performance of the test circuit 502. In a stress mode, the test circuit 502 may be connected to and disconnected from the supply voltage 512 according to the standby signal 514, i.e., it may be connected and disconnected in a same way as a functional circuit (not shown in FIG. 5) of a semiconductor device. Therefore, in the stress mode, the test circuit 502 may encounter the same stress in terms of power activity as the functional circuit.

The reference circuit 504 may be coupled to a supply voltage 512 by way of a switch device 520. The switch device 520 may switch the supply voltage 512 responsive to the mode signal 506. In the stress mode, the reference circuit 504 may be disabled by disconnecting it from the supply voltage 512 by way of the switch device 520. That means, in the stress mode, the reference circuit 504 may be prevented from aging. This may be achieved by connecting a drain terminal of the switch device 520 to all source terminals of all n-type devices in the reference circuit 504. This way, the drain terminal of the switch device 502 is acting as a virtual ground voltage. In the stress mode, this virtual ground voltage is floating to VDD. Consequently, all internal nodes of the reference circuit 504 are floating to VDD. This avoids voltage drops across all devices within the reference circuit 504 and prevents the reference circuit 504 from aging. In the measurement mode, the reference circuit 504 may be connected to the supply voltage 512 to allow for a performance measurement of the reference circuit 504.

As shown in FIG. 5, each of the switch devices 518 and 520 may be implemented as a nFET transistor. The standby signal 514 and/or the mode signal 506 may be coupled to gates of the nFET transistor to control the switching of the supply voltage 512. A signal provided at the gate terminals of the nFET transistors may be inverted by inverters 554 and 556.

The test circuit 502 and the reference circuit 504 may have an identical structure. Each of them may include a storage element 558 and 560, and a logic unit 562 and 564. An output of the test storage element 558 may be coupled to an input of the test logic unit 562, and an output of the reference storage element 560 may be coupled to an input of reference logic unit 562. The storage elements 558 and 560 may be implemented as clocked storage elements, e.g., as flip-flops or as latches. The storage elements 558 and 560 may be set and reset, respectively, in response to a set signal 535. The storage elements 558 and 560 may be set to a predetermined value before a measurement phase is started.

In one implementation, each of the logic units 562 and 564 may include pure combinatorial logic, e.g., the logic units 562 and 564 may contain only NAND-gates, or only NOR-gates or a composition of NAND-gates and NOR-gates. A susceptibility of the test circuit 502 to certain degradation effects may be controlled by a selection of certain gates. For example, a combinatorial logic that contains only or mostly NOR-gates may be particularly susceptible to NBTI and a combinatorial logic that contains only or mostly NAND-gates may be particularly susceptible to HCI. In another implementation, each of the logic units 562 and 564 may include several stages, e.g., several register-logic-register stages. In one implementation, in accordance with the description of FIG. 1, each of the logic units 562 and 564 may be identical to a circuit path of a functional circuit of a semiconductor device, e.g., the logic units 562 and 564 may represent a critical path of the functional circuit.

Referring to FIG. 5, in each of the test circuit 502 and the reference circuit 504 a data input of the storage element 558, 560 is coupled to a data output of an edge generator unit 568, 570, i.e., a data input of the test storage element 558 is provided with a test data signal 565 from a test edge generator unit 568 and a data input of the reference storage element 560 is provided with a reference data signal 559 from a reference edge generator unit 570. As the test circuit 502 and the reference circuit 504 are structured identically, a function of each of the test edge generator unit 568 and the reference edge generator unit 570 will be described further herein referring to the test circuit 502.

The test edge generator unit 568 may provide the test data signal 565 at its data output based on at least one signal provided by the test logic unit 562. In one implementation, the test edge generator unit 568 may invert a test circuit output signal 540 provided at an output of the test logic unit 562. By way of the test edge generator unit 558, the data input of the test storage element 558 is provided with a data signal having a certain data activity.

In the stress mode, the test storage element 558 may be clocked by a clock 508. As illustrated and described in connection with FIG. 1, the clock 508 may be a system clock of a clock domain of a semiconductor device. That means, in the stress mode, the test circuit 502 may encounter the same stress in terms of clock activity as a functional circuit that belongs to the same clock domain. The clock 508 may be coupled to the test storage element 558 by way of a test multiplexer unit 566. The test multiplexer unit 566 may let pass the clock 508 to a clock input of the test storage element 558 responsive to the mode signal 506. The circuit arrangement 500 may be set to the measurement mode and to the stress mode, respectively, by way of the mode signal 506. In general, in the stress mode, the test circuit 502 may be configured in a register-logic-configuration and it may operate synchronously with the clock 508.

In general, in the measurement mode, the clock input of the test storage element 558 may be coupled to at least one signal provided by the test logic unit 562. More specifically, the test storage element 558 may be clocked by a local test clock signal 563 provided at a clock output of the test edge generator unit 568. The local test clock signal 563 at the clock output of the test edge generator unit 568 may be provided to the clock input of the test storage element 558 via the test multiplexer unit 566. That means, in the measurement mode, the test circuit 502 may operate asynchronously with respect to the clock 508. In other words, the test circuit 502 may be self-timed.

The test edge generator unit 568 may provide the local test clock signal 563 based on at least two signals provided by the test logic unit 562. In one implementation, as illustrated in FIG. 5, the test edge generator unit 568 may provide the local test clock signal 563 based on an XOR-connection of the test circuit output signal 540 and an intermediate signal 561 of the test logic unit 562. Due to a time delay between the test circuit output signal 540 and the intermediate signal 561, the local test clock signal 563 may be a pulsed signal. A pulse width of the pulsed signal may correspond to approximately half of a delay time of the test logic unit 562. The pulse width of the pulsed signal may increase when the performance of the test logic unit 562 deteriorates due to aging.

In the measurement mode, a local reference clock signal 557 at the clock input of the reference storage element 560 will be provided in the same manner as the local test clock signal 563 at the clock input of the test storage element 558. That means, the reference circuit 504 may be also self-timed and it may operate asynchronously with respect to the clock 508. In addition, as the performance of the stressed test circuit 502 may differ from the performance of the non-stressed reference circuit 504, the reference circuit 504 may operate asynchronously with respect to the test circuit 502.

In the stress mode, the reference storage element 560 may be unclocked and a clock input of the reference storage element 560 may be coupled to a constant logic value by way a reference multiplexer unit 567. The reference multiplexer unit 567 may let pass the constant logic value, e.g. a logic '0' value, to the clock input of the reference storage element 560 responsive to the mode signal 506. In general, in the stress mode, the reference circuit 504 may be disabled. The reference circuit 504 may be disabled by disconnecting it from the supply voltage 512 via the switch device 520. Additionally or alternatively, the reference circuit 504 may be unclocked.

Generally, in the stress mode, the test circuit 502 may encounter the same stress as a functional circuit of a semiconductor device. Devices of the test circuit 502 may encounter the same supply voltage level, the same power activity and the same clock activity as the function circuit. When the test circuit 502 is placed in the vicinity of the functional circuit, the test circuit 502 may further encounter the same stress in terms of temperature as the functional circuit. Therefore, the test circuit 502 may provide an exact representation of an aging state of the functional circuit.

The reference circuit 504 may be disabled in the stress mode and therefore, may be prevented from aging. As the reference circuit 504 and the test circuit 502 have the same structure, the non-aged reference circuit 504 may provide a reference during a comparison with the aged test circuit 502. It is to be noted that a time period of the stress mode is short compared to a time period of the measurement mode. Therefore, an aging of devices of the reference circuit 504 during the measurement phase may be negligible.

Generally, in the measurement mode, each of the test circuit 502 and the reference circuit 504 may operate in a closed loop configuration. The test circuit 502 may provide the test circuit output signal 540 that oscillates at a frequency f1 according to the performance of the test circuit 502 and the reference circuit 504 may provide a reference circuit output signal 542 that oscillates at a frequency f2 according to the performance of the reference circuit 504. An aging state of the test circuit 502 may be determined by performing a differential frequency measurement. The differential frequency measurement may be performed by an evaluation circuit 524 and no external test equipment may be required for this measurement.

In one implementation, each of the logic units 562 and 564 and the storage elements 558 and 560 may be replicas of a critical path of a functional circuit of a semiconductor device that may operate at a maximum clock frequency f0. The maximum clock frequency f0 may be a frequency of the clock 508, the frequency f2 of the reference circuit output signal 542 may be f2=f0/2, and the frequency f1 of the test circuit output signal 540 may be f1<f0/2 due to aging of FET transistors within the test circuit 502.

As illustrated and described in connection with FIGS. 3-4, the evaluation circuit 524 may include a test counter 530 and a reference counter 532. Referring to FIG. 5, each of the test counter 530 and the reference counter 532 may be implemented as an asynchronous reverse counter and as a frequency divider stage, respectively, that includes n flip-flops. The n flip-flops may be arranged in a chain and a data output of each flip-flop may be coupled to a clock input of the next flip-flop in the chain. A clock input of the first flip-flop in the chain may be coupled to the test circuit output signal 540 and the reference circuit output signal 542, respectively. Before a measurement phase is started, all flip-flops of the test counter 530 and the reference counter 532 may be set to a logic '1' value by way of the set signal 535. The measurement phase may start and stop responsive to a measurement control signal 534. When the measurement control signal 534 has a logic '1' value, an AND-gate 569 may pass the test counter output signal 540 to the clock input of the first flip-flop in the chain of the test counter 530, and an AND-gate 571 may pass the reference counter output signal 542 to the clock input of the first flip-flop in the chain of the reference counter 532. When the measurement control signal 534 has a logic '0' value, each of the test counter 530 and the reference counter 532 may stop counting and a count value may be provided by way of a test counter state signal 536 and a reference counter state signal 538, respectively.

The value of the test counter state signal 536 may be subtracted from the value of the reference counter state signal 538 to determine the aging of the test circuit 502. In another implementation, as illustrated and described in connection with FIG. 4, the reference counter 532 may provide a signal that stops the counting of the test counter 530 and the reference counter 532. For example, the counting may be stopped responsive to an output of the last flip-flop in the chain of flip-flops of the reference counter 532. The counting may be stopped as soon as the signal at the output of that last flip-flop in the chain of the reference counter 532 reaches a logic '0' value. In this case, the aging of the test circuit 502 may be directly derived from the count value of the test counter 530 without a need for any subtraction operation.

Figure 6:
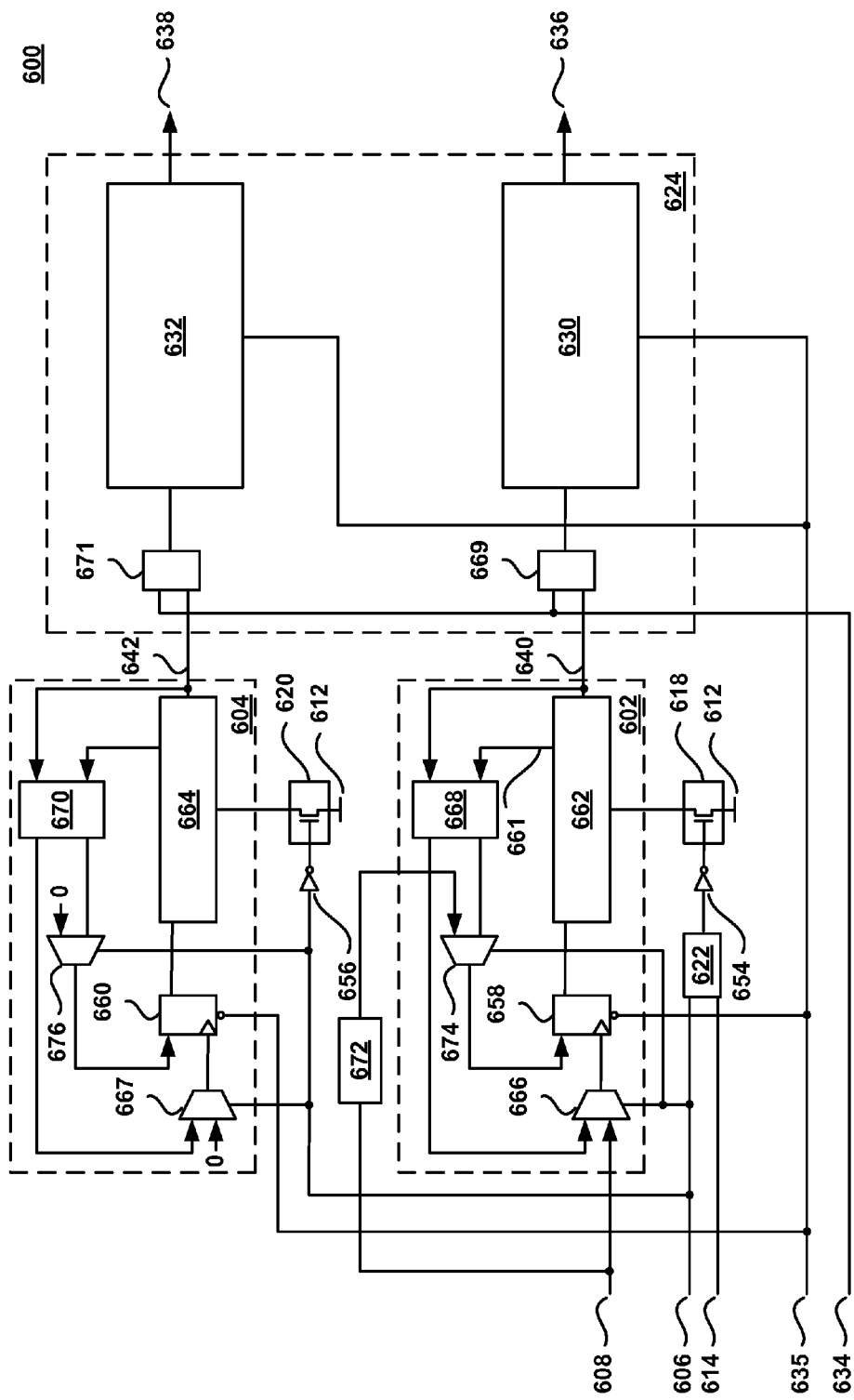
FIG. 6 shows a further exemplary circuit arrangement that is similar to the circuit arrangement of FIG. 5.

FIG. 6 shows a further exemplary circuit arrangement 600. The circuit arrangement 600 is similar to the circuit arrangement 500 as illustrated and described in connection with FIG. 5. Therefore, those elements common to FIG. 5 may not be discussed in detail in the following.

Referring to FIG. 6, the circuit arrangement 600 includes a test storage element 658 and a data activity of a signal provided at a data input of the test storage element 658 may be configurable. The data activity at the data input of the test storage element 658 may affect a susceptibility of a test circuit 602 to certain degradation effects. For example, the test circuit 602 may be particularly susceptible to NTBI when the data activity is high and the test circuit 602 may be particularly susceptible to HCI when the data activity is low.

The data activity at the data input of the test storage element 658 may be controlled by way of a divider unit 672. In one implementation, the divider unit 672 may include a frequency divider and the frequency divider may receive a clock signal 608. In one implementation, a division rate of the frequency divider may be configured by way of a control signal (not shown in FIG. 6). In another implementation, the division rate of the frequency divider may be determined by a hardwired logic that is part of the divider unit 672. The frequency divider may divide a frequency of the clock signal 608 and a divided clock signal may be provided from an output of the divider unit 672 to the data input of the test storage element 658 via a data multiplexing unit 674. The data multiplexing unit 674 may be controlled by a mode signal 606. In the stress mode, the data multiplexing unit 674 may pass the divided clock signal to the data input of the test storage element 658 and in the measurement mode, the data multiplexing unit 674 may couple an output of the test edge generator unit 668 with the data input of the test storage element 658. Therefore, in the measurement mode, the test circuit 602 may operate in the same way as the test circuit 502 as illustrated and described in connection with FIG. 5.

Similar to the data multiplexing unit 674, a reference circuit 604 may contain a multiplexing unit 676. The multiplexing unit 676 may be a dummy multiplexing unit and it may not affect the functionality of the reference circuit 604. The multiplexing unit 676 may be provided to compensate for a difference in a path delay of the test circuit 602 and the reference circuit 604.

In the implementation as illustrated in FIG. 6, in the stress mode, the signal at the data input of the test storage element 658 is derived from the clock signal 608. In another implementation, a signal that is independent from the clock signal 608 may be provided to the data input of the test storage element 658 in the stress mode.

Figure 7:
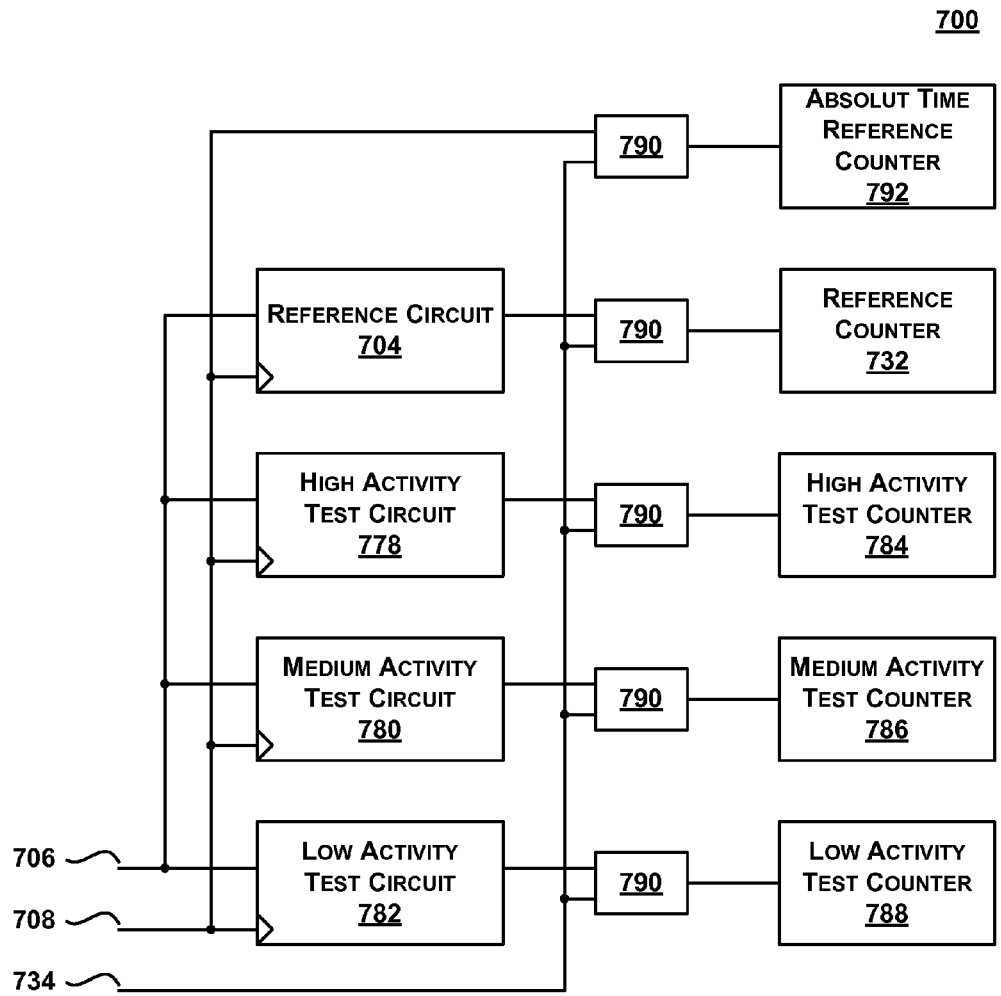
FIG. 7 shows an exemplary circuit arrangement with a reference circuit and three test circuits.

FIG. 7 shows an exemplary circuit arrangement 700 with a reference circuit 704 and three test circuits that include a high activity test circuit 778, a medium activity test circuit 780 and a low activity test circuit 782. The structure of the reference circuit 704 may correspond to the structure of the reference circuit 604 as illustrated and described in connection with FIG. 6. The structure of each of the high activity test circuit 778, the medium activity test circuit 780 and the low activity test circuit 782 may correspond to the structure of the test circuit 602 as illustrated and described in connection with FIG. 6. The reference circuit 704, the high activity test circuit 778, the medium activity test circuit 780 and the low activity test circuit 782 may operate in two modes, a stress mode and a measurement mode, and a setting of the mode may configured by way of a mode signal 706. The high activity test circuit 778, the medium activity test circuit 780 and the low activity test circuit 782 may differ in a setting of their respective divider units. Therefore, in the stress mode, each of the high activity test circuit 778, the medium activity test circuit 780 and the low activity test circuit 782 may operate at a different data switching activity. For example, a data activity at a data input of a test storage element of the high activity test circuit 778 may be higher than a data activity at a data input of a test storage element of the medium activity test circuit 780. Furthermore, the data activity at the data input of the test storage element of the medium activity test circuit 780 may be higher than a data activity at a data input of a test storage element of the low activity test circuit 782. Due to the different data activities, a susceptibility of the high activity test circuit 778, the medium activity test circuit 780 and the low activity test circuit 782 to certain degradation effects may differ. For example, the high activity test circuit 778 may be particularly susceptible to HCI, the low activity test circuit 782 may be particularly susceptible to NBTI and the medium activity test circuit 780 may be susceptible to NBTI and HCI in approximately equal shares. In one implementation, the data activities of the high activity test circuit 778, the medium activity test circuit 780 and the low activity test circuit 782 may be configured such as to represent different data activities of a functional circuit of a semiconductor device. For example, the high activity test circuit 778 may represent a maximum data activity of the functional circuit and the low activity test circuit 782 may represent a minimum data activity of the functional circuit.

An output of each of the reference circuit 704, the high activity test circuit 778, the medium activity test circuit 780 and the low activity test circuit 782 may be coupled to a respective counter: the reference circuit 704 may be coupled to a reference counter 732, the high activity test circuit 778 may be coupled to a high activity test counter 784, the medium activity test circuit 780 may be coupled to a medium activity test counter 786 and the low activity test circuit 782 may be coupled to a low activity test counter 788. A signal at the output of each of the reference circuit 704, the high activity test circuit 778, the medium activity test circuit 780 and the low activity test circuit 782 may be provided to the respective counter 732, 784, 786, 788 via an enabling circuit 790. The enabling circuits 790 may pass through the signal responsive to a measurement control signal 734 that controls a start and a stop of a measurement phase. As illustrated and described in connection with FIG. 5, each of the enabling circuits 790 may include an AND-gate. During the measurement phase, the counters 732, 784, 786 and 788 may be incremented and decremented, respectively, according to a frequency of the signal provided at the output of the respective circuit 704, 778, 780 and 782. As illustrated and described in connection with FIG. 6, at the end of the measurement phase, the values of the counters 732, 784, 786 and 788 may be evaluated to determine an aging state of a functional circuit.

The circuit arrangement 700 may include a circuit that provides an absolute time reference. In one implementation, as illustrated in FIG. 7, an absolute time reference counter 792 may be coupled to the clock signal 708 via an enabling circuit 790. The enabling circuit 790 may pass the clock signal 708 to an input of the absolute time reference counter 792 responsive to the measurement control signal 734. During the measurement phase, the absolute time reference counter 792 may be incremented and decremented, respectively, according to the clock signal 708. At the end of the measurement phase, a value of the absolute time reference counter 792 may denote an absolute time reference. This value of the absolute time reference counter 792 may depend on the length of the measurement phase. Therefore, this value of the absolute time reference counter 792 may be independent from any path delays or aging effects.

The absolute time reference counter 792 may be implemented to perform a calibration measurement at a time t0. At the time t0, the test circuits 778, 780 and 782 may not yet be stressed. For the calibration measurement, the circuit arrangement 700 may be switched in the measurement mode via the mode signal 706 and a measurement phase may get started and stopped via the measurement control signal 734. At the end of the measurement phase, an absolute time difference in the performance of the circuits 704, 778, 780 and 782 may be determined by comparing the values of the respective counters 732, 784, 786 and 788 with the value of the absolute time reference counter 792. If the reference circuit 704, the high activity test circuit 778, the medium activity test circuit 780 and the low activity test circuit 782 are structured identically, the values of the counters 732, 784, 786 and 788 at the time t0 may be identically. However, differences in the circuit structure or in the device structure of the circuits 704, 778, 780 and 782 may cause a difference in performance already at the time to. One or more values that correspond to the difference in performance at the time t0 may be referred to as "calibration values" herein. The calibration values may be stored in a storage element, e.g. in a memory. The one or more calibration values may be used to adjust a result of a differential frequency measurement that will be performed to determine an aging state of a functional circuit. Furthermore, the one or more calibration values may be used to determine a timing margin of the test circuits 778, 780, 782 and to deduce from thereof a timing margin of a critical path of a functional circuit.

In the implementation as illustrated and described in connection with FIG. 7, the circuit arrangement 700 includes three test circuits 778, 780 and 782 and the data activity of each of the three test circuits 778, 780 and 782 is different in the measurement mode. In other implementations, the circuit arrangement may include just two test circuits with different data switching activities or more than three test circuits with different data switching activities. It is to be noted that an absolute time reference counter, like the absolute time reference counter 792, may be also implemented in any of the circuit arrangements as illustrated and described in connection with FIGS. 1-6 and the absolute time reference counter may be included in an evaluation circuit. That means, an absolute time reference counter may be implemented in a circuit arrangement that includes a reference circuit and just one test circuit.

Figure 8:
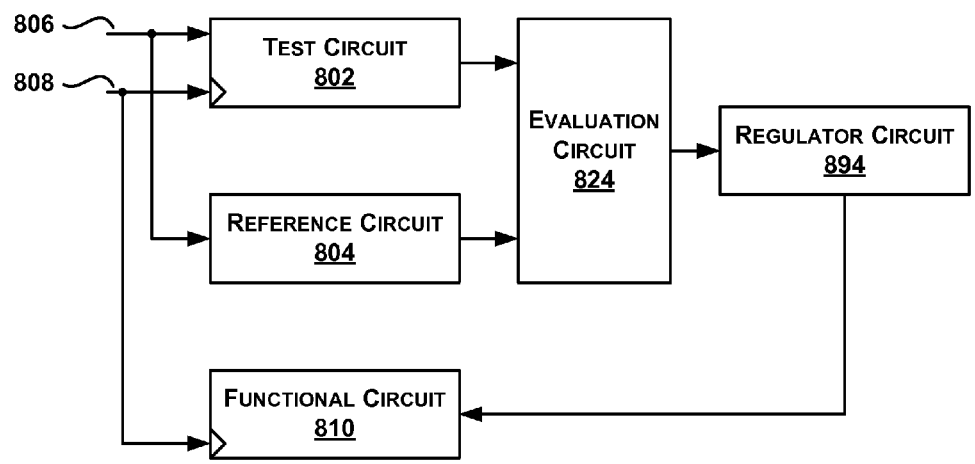
FIG. 8 shows a system with a test circuit, a reference circuit, an evaluation circuit and a regulator circuit.

FIG. 8 shows a system 800 with a test circuit 802, a reference circuit 804 and an evaluation circuit 824. A mode signal 806 may be provided in order to control a mode of operation of each of the test circuit 802 and the reference circuit 804.

In a first mode of operation, the test circuit 802 may be clocked by a clock 808, i.e., the test circuit 802 may operate synchronously with the clock 808. The devices of the test circuit 802 may be subject to aging in accordance with a switching activity of the clock 808. Therefore, the first mode of operation may be referred to as a stress mode and the test circuit 802 may be referred to as a stressed test circuit 802 or aged test circuit 802.

In a second mode of operation, the test circuit 802 may be disconnected from the clock 808. The test circuit 802 may be configured in a way that it operates asynchronously with respect to the clock 808. In the second mode of operation, a performance of the stressed test circuit 802 may be measured. Therefore, the second mode of operation may be referred to as a measurement mode.

In the stress mode, the reference circuit 804 may be disabled. Therefore, devices of the reference circuit 804 may be prevented from aging and the reference circuit 804 may be referred to as a non-stressed reference circuit 804 or a non-aged reference circuit 804.

In the measurement mode, a performance of the non-stressed reference circuit 804 may be measured and the non-stressed reference circuit 804 may operate asynchronously with respect to the stressed test circuit 802. As the reference circuit 804 is not coupled to the clock 808, it may further operate asynchronously with respect to the clock 808.

The evaluation circuit 824 may be coupled to an output of the test circuit 802 and with an output of the reference circuit 804. The evaluation circuit 824 may perform a differential frequency measurement based on a signal provided at the output of the test circuit 802 and based on a signal provided at the output of the reference circuit 804. In one implementation, the evaluation circuit 824 may perform the differential frequency measurement while each of the test circuit 802 and the reference circuit 804 may operate in the measurement mode. By way of the differential frequency measurement, a difference in the performance of the stressed test circuit 802 and the reference circuit 804 may be determined.

In one implementation, in the measurement mode, each of the test circuit 802 and the reference circuit 804 may be configured in an oscillator topology and the signal provided at the output of each of the test circuit 802 and the reference circuit 804 may oscillate at a frequency that corresponds to an aging state of the test circuit 802 and the reference circuit 804, respectively. As the reference circuit 804 is protected against aging in the stress mode, the non-stressed reference circuit 804 may oscillate at a higher frequency than the stressed test circuit 802.

Referring to FIG. 8, the system 800 may further contain a functional circuit 810. The functional circuit 810 may perform data processing and/or data storage. For example, the functional circuit 810 may be a processor or a part of a processor. The functional circuit 810 may be coupled to the clock 808, i.e. the functional circuit 810 and the test circuit 802 may belong to a common clock domain of the system 800. Additionally or alternatively, the functional circuit 810 and the test circuit 802 may be coupled to a common supply voltage. In other words, the functional circuit 810 and the test circuit 802 may belong to the same power domain of the system 800. In one implementation, the test circuit 802 may be placed in the vicinity of the functional circuit 810 within the system 800. That means, the test circuit 802 may encounter the same stress in terms of temperature as the functional circuit 810, and the device parameters of the test circuit 802 and the functional circuit 810 may be the same.

In general, the system 800 may include various functional circuits and an aging state of each of those functional circuits may vary depending on various factors, e.g., on a clock activity, a power activity and/or a position of the functional circuit within the system 800. The test circuit 802 may be exposed to the same stress as a functional circuit 810 of the system 800 by providing to the test circuit 802 the same clock activity and the same power activity as to the functional circuit 810 and by placing the test circuit 802 in the vicinity of the functional circuit 810. Therefore, the test circuit 802 may provide an accurate representation of an aging state of the functional circuit 810 within the system 800.

Referring to FIG. 8, the system 800 may further contain a regulator circuit 894. The regulator circuit 894 may adjust an operating parameter of the functional circuit 810 based on an output of the evaluation circuit 824. The output of the evaluation circuit may indicate an aging state of the test circuit 802 and the functional circuit 810, respectively. The regulator circuit 894 may adjust the operating parameter to compensate for impacts of aging. For example, the operating parameter may be a supply voltage, a frequency and/or a body bias voltage. In one implementation, the supply voltage of the functional circuit may be increased to compensate for aging. Additionally or alternatively, the frequency of the clock 808 may be decreased, i.e., the functional circuit 810 may operate at a lower clock frequency to avoid a malfunction of the functional circuit 810. Additionally or alternatively, a body bias voltage of devices of the functional circuit 810 may be regulated, i.e., the body bias of nFETs and pFETs within the functional circuit 810 may be adjusted in such a way to reduce threshold voltages of the nFETs and pFETs to compensate a performance loss due to aging.

The implementation as illustrated and described in connection with FIG. 8 may be combined with any of the implementation as illustrated and described in connection with FIGS. 1-7. For example, the evaluation circuit 824 may include counters to perform the differential frequency measurement. Additionally or alternatively, each of the test circuit 802 and the reference circuit 804 may include at least one clocked storage element that is coupled to a stage of combinatorial logic. In one implementation, several test circuits and reference circuits may be distributed across the system 800 to determine aging states of various functional circuits that are placed at various locations within the system 800. In another implementation, the clock signal 808 may be used as an absolute time reference within the evaluation circuit 824. For example, the evaluation circuit 824 may contain an absolute reference counter as illustrated and described in connection with FIG. 7.

Exemplary Method

Figure 9:
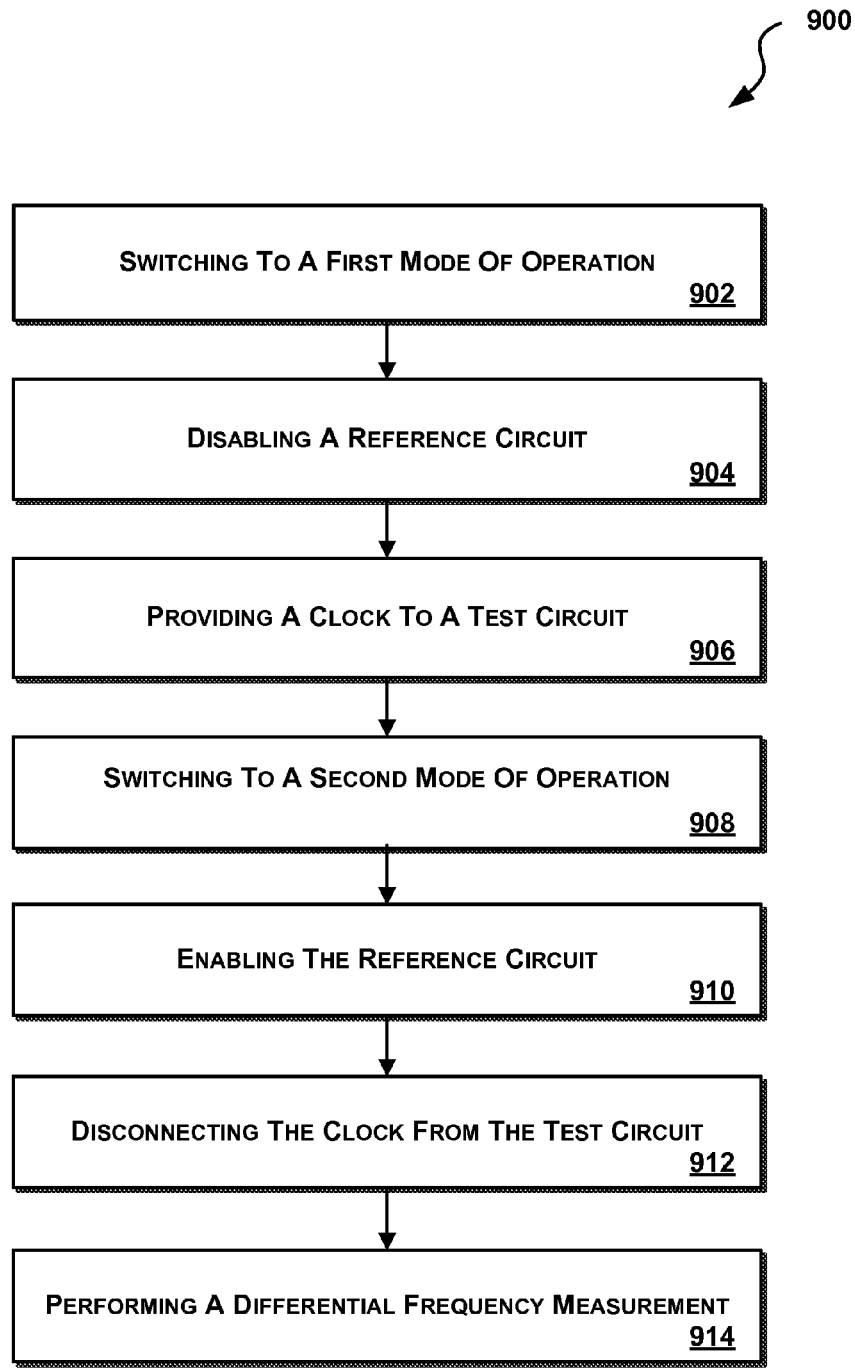
FIG. 9 illustrates a flow diagram that includes a number of operations determining an aging state of a circuit.

FIG. 9 illustrates a flow diagram 900 that includes a number of operations determining an aging state of a circuit. Unless stated otherwise, the order in which the operations are described is not intended to be construed as a limitation. Operations may be repetitive, may be combined in any order and/or may be in parallel to implement the process. In portions of the following discussion, reference may be made to the illustrations of FIGS. 1-8 and the subject matter thereof.

The procedures described in connection with FIG. 9 may be realized utilizing the previously described implementations.

Referring to FIG. 9, at block 902, an arrangement is switched to a first mode of operation. The first mode of operation may correspond to the stress mode as was described earlier herein.

At block 904, a reference circuit is disabled. The reference circuit may be disabled by disconnecting it from a supply voltage. Therefore, devices of the reference circuit may be prevented from aging.

At block 906, a clock may be provided to a test circuit. During the stress mode, devices of the test circuit may be subject to aging according to a switching activity of the clock.

At block 908, an arrangement is switched to a second mode of operation. The second mode of operation may correspond to the measurement mode as was described earlier herein. In one implementation, the measurement mode may be entered once per day. Additionally or alternatively, the measurement mode may be entered during every startup phase of a semiconductor device.

At block 910, the reference circuit is enabled. The reference circuit may be enabled by connecting it to the supply voltage.

At block 912, the clock is disconnected from the test circuit.

At block 914, a differential frequency measurement is performed based on an output of the test circuit and an output of the reference circuit. Each of the test circuit and the reference circuit may operate asynchronously with respect to the clock and with respect to each other. A signal at the output of each of the test circuit and the reference circuit may oscillate at a frequency that corresponds to a performance of the test circuit and the reference circuit, respectively. By way of the differential frequency measurement, a difference in the performance of the test circuit and the reference circuit may be determined. The difference in the performance of the test circuit and the reference circuit may be indicative for the aging state of the test circuit. It is to be noted that a time period of the measurement mode is short compared to a time period of the stress mode. Therefore, an aging of each of the reference circuit and the test circuit during the measurement mode may be negligible.

In one implementation, each of the test circuit and the reference circuit may comprise at least one storage element and at least on stage of combinatorial logic. In the measurement mode, an output of the at least one stage of combinatorial logic may be coupled to an input of the at least one storage element. Therefore, each of the test circuit and the reference circuit may operate in a closed loop configuration and a respective output may oscillate in accordance with a performance of each of the test circuit and the reference circuit.

In one implementation, the test circuit and the reference circuit may be calibrated. The calibration may be performed at a time t0 where the test circuit has not yet been stressed. By way of the calibration, a calibration value may be determined that corresponds to a difference in performance of the test circuit and the reference circuit at the time t0. The difference in performance may be caused by a difference in the circuit structure and/or a difference in the device structure. A result of the differential frequency measurement may be adjusted based on the calibration value. Therefore, when determining the aging state of the test circuit, it will be accounted for differences between the test circuit and the reference circuit. The calibration value may be stored in a storage element.

In one implementation, an operating parameter of a functional circuit may be adjusted based on a result of the differential frequency measurement. The test circuit may be implemented in a way that it represents the functional circuit in terms of aging. Therefore, when the aging of the test circuit is detected an operating parameter of the functional circuit may be adjusted to compensate for the impacts of aging. For example, the operating parameter may be a supply voltage, a frequency or a body bias voltage. In one implementation, the supply voltage of the functional circuit may be increased to compensate for the aging. Additionally or alternatively, the frequency of a clock that is coupled to the functional circuit may be decreased. Consequently, the functional circuit may operate at a lower clock frequency to prevent a malfunction of the functional circuit due to aging. Additionally or alternatively, a body bias voltage of devices of the functional circuit may be regulated.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims. It is within the scope of this disclosure to combine various features of the different implementations and claims to produce variations thereof.

What is claimed is:

1. A semiconductor device, comprising:
a functional circuit configured to operate at a clock, devices of the functional circuit configured to encounter a stress in accordance with an activity of the clock;
a test circuit configured to operate synchronously with the clock in a first mode, devices of the test circuit configured to encounter a same stress as the devices of the functional circuit in the first mode; and
a reference circuit, devices of the reference circuit configured to encounter no stress in the first mode.

2. The semiconductor device of claim 1, wherein the test circuit is further configured to operate asynchronously with respect to the clock in a second mode and wherein the reference circuit is configured to operate asynchronously with respect to the test circuit in the second mode.

3. The semiconductor device of claim 1, wherein the reference circuit is configured to be disabled in the first mode.

4. The semiconductor device of claim 3, wherein the reference circuit is coupled to a supply voltage and wherein the reference circuit is disabled by disconnecting the reference circuit from the supply voltage.

5. The semiconductor device of claim 2, wherein each of the test circuit and the reference circuit comprises at least one storage element and at least one stage of combinatorial logic, an output of the combinatorial logic being coupled to a clock input of the storage element in the second mode.

6. The semiconductor device of claim 1, further comprising:
an evaluation circuit coupled to an output of the test circuit and an output of the reference circuit.

7. The semiconductor device of claim 6, wherein the evaluation circuit is configured to perform a differential frequency measurement based on a signal provided at the output of the test circuit and a further signal provided at the output of the reference circuit.

8. The semiconductor device of claim 6, wherein the evaluation circuit comprises a first counter coupled to the output of the test circuit and a second counter coupled to the output of the reference circuit.

9. The semiconductor device of claim 8, wherein the evaluation circuit further comprises a third counter coupled to the clock.

10. The semiconductor device of claim 1, wherein the clock is a gated clock.

11. The semiconductor device of claim 1, wherein the test circuit and the functional circuit being coupled to a common supply voltage.

12. The semiconductor device of claim 11, wherein the supply voltage is a switched supply voltage, the supply voltage configured to be switched on and off to the test circuit and to the functional circuit at substantially the same time in the first mode.

13. The semiconductor device of claim 1, wherein the first mode is a mode in which devices of the test circuit are subject to aging and wherein the second mode is a measurement mode.

14. A semiconductor device, comprising:
a test circuit configured to operate at a clock in a first mode in which devices of the test circuit are subject to aging in accordance with an activity of the clock;
a reference circuit configured to be protected against aging in the first mode; and
an evaluation circuit configured to perform a differential frequency measurement based on an output of the test circuit and an output of the reference circuit in a second mode.

15. The semiconductor device of claim 14, further comprising a functional circuit placed in the vicinity of the test circuit, the functional circuit configured to operate at the clock, wherein the test circuit and the functional circuit are coupled to a same supply voltage.

16. The semiconductor device of claim 15, wherein devices of the functional circuit are configured to encounter a same aging as devices of the test circuit in the first mode.

17. The semiconductor device of claim 15, wherein the supply voltage is a switched supply voltage, the supply voltage configured to be switched on and off to the test circuit and to the functional circuit at substantially the same time in the first mode.

18. The semiconductor device of claim 14, wherein each of the test circuit and the reference circuit is configured to operate in an oscillator topology in the second mode.

19. The semiconductor device of claim 14, wherein the test circuit is further configured to operate asynchronously with respect to the clock in the second mode and wherein the reference circuit is further configured to operate asynchronously with respect to the test circuit in the second mode.

20. The semiconductor device of claim 14, wherein the reference circuit is configured to be disabled in the first mode.

21. The semiconductor device of claim 20, wherein the reference circuit is coupled to a supply voltage and wherein the reference circuit is disabled by disconnecting the reference circuit from the supply voltage.

22. The semiconductor device of claim 14, wherein each of the test circuit and the reference circuit comprises at least one storage element and at least one stage of combinatorial logic, an output of the combinatorial logic being coupled to a clock input of the storage element in the second mode.

23. The semiconductor device of claim 14, wherein the evaluation circuit comprises a first counter coupled to the output of the test circuit and a second counter coupled to the output of the reference circuit.

24. The semiconductor device of claim 23, wherein the evaluation circuit further comprises a third counter coupled to the clock.

25. The semiconductor device of claim 14, wherein the clock is a gated clock.

* * * * *